(12) United States Patent
Nelson et al.

(10) Patent No.: US 9,190,845 B2
(45) Date of Patent: Nov. 17, 2015

(54) METHOD AND APPARATUS FOR ADAPTIVELY CONTROLLING WIND PARK TURBINES

(75) Inventors: Robert J. Nelson, Orlando, FL (US);
Hongtao Ma, Orlando, FL (US)

(73) Assignee: Siemens Aktiengesellschaft, München (DE)

( * ) Notice: Subject to any disclaimer, the term of this patent is extended or adjusted under 35 U.S.C. 154(b) by 710 days.

(21) Appl. No.: 13/550,699

(22) Filed: Jul. 17, 2012

(65) Prior Publication Data

US 2014/0021720 A1 Jan. 23, 2014

(51) Int. Cl.
*H02J 1/00* (2006.01)
*H02J 3/00* (2006.01)
*H02J 3/16* (2006.01)
*H02J 3/38* (2006.01)
*H03H 1/00* (2006.01)
*G06F 19/00* (2011.01)

(52) U.S. Cl.
CPC ... *H02J 3/16* (2013.01); *H02J 3/38* (2013.01); *H02J 3/386* (2013.01); *G06F 19/00* (2013.01); *H03H 1/00* (2013.01); *Y02E 10/763* (2013.01); *Y02E 40/34* (2013.01)

(58) Field of Classification Search
CPC ............ Y02E 10/763; H02J 3/38; H02J 1/10; H02P 9/04; F03D 7/048; F03D 7/0284; G06F 19/00

USPC ................ 307/84, 82, 43, 44, 80, 45, 46, 86; 700/287, 286; 290/44, 42, 45, 43; 323/364, 360; 363/95

See application file for complete search history.

(56) References Cited

U.S. PATENT DOCUMENTS

| 2009/0295231 A1* | 12/2009 | Gaffney et al. | 307/80 |
| 2010/0332040 A1* | 12/2010 | Garcia | F03D 7/0284 700/287 |
| 2011/0043186 A1* | 2/2011 | Bech | H02J 3/1821 323/364 |
| 2013/0148394 A1* | 6/2013 | O'Brien | H02J 3/383 363/95 |

FOREIGN PATENT DOCUMENTS

WO WO 2011050807 A2 * 5/2011 ............ H02J 3/16

* cited by examiner

*Primary Examiner* — Rexford Barnie
*Assistant Examiner* — Jagdeep Dhillon

(57) ABSTRACT

A wind turbine park (242) connected to a transmission system (234). The wind turbine park includes a component (230) for determining a short circuit ratio and based thereon for determining a parameter adjustment recipe, and a controller (238) for controlling an output of the wind turbine park, the controller (238) executing a control algorithm using a determined parameter adjustment recipe, the determined parameter adjustment recipe responsive to the short circuit ratio and determined within the component (230) or within the controller (238).

16 Claims, 2 Drawing Sheets

METHOD AND APPARATUS FOR ADAPTIVELY CONTROLLING WIND PARK TURBINES

FIELD OF THE INVENTION

The invention relates generally to a method and apparatus for controlling operation of a wind park, and more specifically to adaptively controlling the wind park responsive to the conditions of the grid to which the wind turbine park is connected.

BACKGROUND OF THE INVENTION

Due to current efforts to reduce consumption of natural resources, the conversion of wind energy to electrical energy using wind turbine generators is becoming more prevalent. Wind turbines exploit wind energy by converting the wind energy to electricity for distribution to end users.

A fixed-speed wind turbine is typically connected to the grid through an induction (asynchronous) generator for generating real power. Wind-driven blades drive a rotor of a fixed-speed wind turbine that in turn operates through a gear box (i.e., a transmission) with a fixed rotational speed output. The fixed-speed gear box output is connected to an induction generator for generating real power.

The rotor and its conductors rotate faster than the rotating flux applied to the stator from the grid (i.e., higher than the synchronous field frequency). At this higher speed, the direction of the rotor current is reversed, in turn reversing the counter EMF generated in the rotor windings, and by generator action (induction) causing current (and real power) to be generated in and flow from the stator windings.

The frequency of the generated stator voltage is the same as the frequency of the applied stator voltage providing the excitation. The induction generator may use a capacitor bank for reducing reactive power consumption (i.e., the power required to generate the stator flux) from the power system.

The fixed-speed wind turbine is simple, reliable, low-cost and proven. But its disadvantages include uncontrollable reactive power consumption (as required to generate the stator rotating flux), mechanical stresses, limited control of power quality and relatively inefficient operation. In fact, wind speed fluctuations result in mechanical torque fluctuations that then result in fluctuations in the electrical power on the grid.

In contrast to a fixed-speed wind turbine, the rotational speed of a variable speed wind turbine can continuously adapt to the wind speed, with the blade speed maintained at a relatively constant value corresponding to a maximum electrical power output through the use of a gear box disposed between the wind turbine rotor and the generator rotor.

The variable speed wind turbine may be of a doubly-fed induction generator (DFIG) design or a full converter design. The doubly-fed induction generator uses a partial converter to interchange power between the wound induction generator rotor and the power system. The full converter wind turbine is typically equipped with a synchronous or asynchronous generator (the output of which is a variable frequency AC based on the wind speed) and connected to the grid through a power converter that rectifies the incoming variable-frequency AC to DC and inverts the DC to a fixed-frequency 60 Hz AC. Variable-speed wind turbines have become widespread due to their increased efficiency over fixed-speed wind turbines and superior ancillary service capabilities.

FIG. 1 illustrates components of an exemplary variable speed wind turbine 8, including rotor blades 12 for converting wind energy to rotational energy for driving a shaft 16 connected to a gearbox 18. The wind turbine also includes a structural support component, such as a tower and a rotor pointing mechanism, not shown in FIG. 1. The gearbox 18 converts low speed rotation to high speed rotation, as required for driving a generator 20 to generate electricity.

Electricity generated by the generator 20 is supplied to a power electronics system 24 to adjust the generator output voltage and/or frequency for supply to a grid 28 via a step-up transformer 30. The low-voltage side of the transformer is connected to the power electronics system 24 and the high-voltage side to the grid 28. Generally, the power electronics system imparts characteristics to the generated electricity that are required to match electricity flowing on the grid, including controllable active power flow and voltage regulation and improved network voltage stability.

One embodiment of the power electronics system 24 includes a generator-side converter for converting the generated AC electricity to DC and an output capacitor for filtering the DC current. DC current is supplied to a line side converter (inverter) for producing 60 Hz AC power supplied to the grid 28. The amount of power available from the wind turbine is determined by operation of the generator-side converter.

One type of converter employed in a variable speed wind turbine, referred to as a full converter or a back-to-back converter, comprises a power converter connected to the generator side, a DC link and a power converter connected to the grid. The full converter converts an input voltage, i.e., a fixed frequency alternating current, a variable frequency alternating current (due to the variable wind speed) or a direct current, as generated by the wind turbine, to a desired output frequency and voltage as determined by the grid that it supplies. Typically using thryistors, the full converter converts the electricity produced by the generator to DC and transfers this energy to the DC link.

From the DC link the electricity is supplied to the grid-side active converter where it is transformed to fixed frequency AC electricity and supplied to the grid.

FIG. 2 illustrates a wind park or wind farm 50 comprising a plurality of wind turbines 54 (such as the variable speed wind turbine 8 illustrated in FIG. 1 or a fixed speed wind turbine) connected through a feeder or collector 56, which serves as a distribution system within the wind turbine park. Several feeders may be required for an average size wind turbine park.

The wind park 50 further comprises a wind park controller 60 and a wind park transformer 64. The wind park controller 60 controls operation of the wind turbines 54. The transformer 64 connects the wind park collector 56 to a utility system or grid 68 via a point of common coupling (PCC) 72.

The wind turbines 54 bidirectionally communicate with the controller 60 via control lines 78. The signals carried over the control lines 78 relate to wind turbine output power, wind turbine status, a reference power, wind turbine operational commands, etc. The controller 60 is also connected to the PCC 72 via a control line 80. This connection allows the controller 60 to detect power parameters, such as voltage and current, at the PCC 72.

The wind park controller 60 generally fulfills a plurality of control functions related to the individual wind turbines 54 and therefore the output of the wind park 50. For example, the wind park controller 60 collects data characterizing the current state of each wind turbine 54 and in response thereto independently controls operation of each wind turbine 54.

The wind park 50 is only an example of a conventional wind turbine park. The teachings of the present are not restricted to the depicted layout of FIG. 2.

BRIEF DESCRIPTION OF THE DRAWINGS

The invention is explained in the following description in view of the drawings that show.

DETAILED DESCRIPTION OF THE INVENTION

Figure 1:
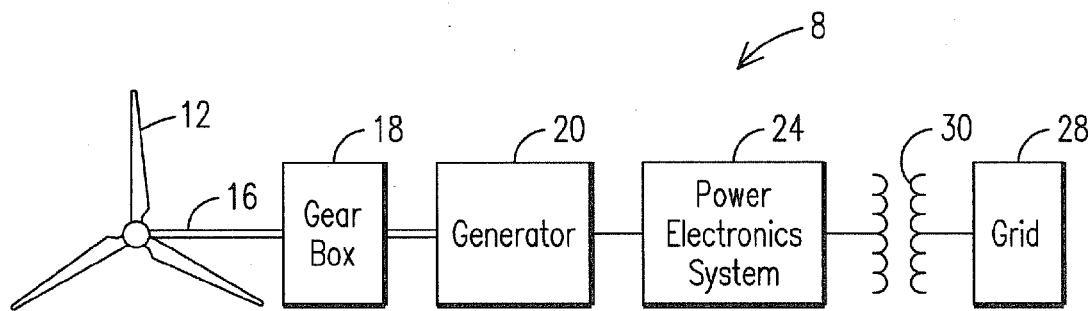
FIG. 1 is a block diagram of a prior art wind turbine.

The present invention discloses the use of an adaptive control algorithm for controlling a power system, where the algorithm is modified in response to changes in a measured local voltage when reactive power is injected into the system to increase the system voltage or absorbed from the system to decrease the system voltage. The amount by which the local voltage changes as a result of a change in VAR generation or absorption is an indication of the system impedance and also allows calculation of the short circuit ratio (SCR), as more completely described below.

Short circuit "strength" is a measure of the ability of the system to maintain a system voltage within predefined limits when a short circuit occurs on the system. A system designated as a "strong" system typically has a short circuit ratio of about 10 or higher. The short circuit ratio (SCR) is the ratio of the three-phase short circuit MVA as delivered during a short circuit event divided by the nominal turbine MWt capacity (megawatt thermal, i.e., the heat generating capacity of the steam-producing plant supplying the steam to turn the turbine).

In effect, the short circuit ratio is a convenient indicator of the system impedance. It is relatively easy to determine the short circuit ratio (also referred to as short circuit MVA) at any point on the transmission system under system design conditions (e.g., all generators in service and all lines "in"). However when lines and/or generators are taken out of service during normal operation of the system, the actual short circuit ratio may be considerably lower than its design value. Without knowledge of the short circuit ratio under such normal operating conditions, control of the system voltage is difficult.

The short circuit MVA is the short circuit current (kAmps/phase) multiplied by the pre-fault line-to-ground voltage (kV) times three (for a three phase system). The resulting product is simply a measure of the impedance of the transmission system. A high impedance system has a low short circuit MVA. Note that the short circuit MVA is not related to the wind turbines, and in fact is calculated with the wind turbines disconnected from the system.

The SCR is also an indication of the system's ability to respond to reactive power injections and absorptions. A low-SCR ("weak") system is very responsive to reactive power injections (or absorptions) i.e., the system voltage changes rapidly as the amount of reactive power injected (or absorbed) changes. It is therefore difficult to stabilize the system voltage on a weak system. A high-SCR ("strong") system is largely unresponsive to reactive power injections (and absorptions) and the system voltage is therefore more easily and more rapidly controlled. A "strong" system is therefore considered more robust.

In equation form, the SCR is, $$SCR = MVAsc/MWt \quad (1)$$

where:

MVAsc is a product of the transmission system three-phase short circuit current (amperes), the pre-fault line nominal voltage (volts, line-to-line), and the square root of 3 (equals 1.732), with that quantity divided by 1E6, and MWt is the aggregate turbine capability MWt (i.e., a sum of the megawatts of wind turbine capability within the wind turbine park) at the location where the wind turbine park bus is connected to the grid or transmission system. A wind turbine has a maximum capability, i.e., a 2.3 MW turbine can generate 2.3 MW at its rated wind speed (and higher), less at lower wind speeds. Therefore a wind park with 44 turbines, each rated at 2.3 MW, would have a MWt value of 101.2 (that is, 2.3×44=101.2).

Generally, a system operator identifies segments of the system as either "weak" or "strong" by defining SCR values associated with each of these two classifications. There is no industry-wide uniform definition for "weak" and "strong" classes. Since most wind turbine parks are located where the prevailing wind conditions are best and such sites are typically a significant distance from load centers, many wind turbine parks are classified as having "weak" short circuit strength.

Prior art wind park control systems typically assume some nominal level of system short circuit strength (i.e., for a proximate region of the grid to which the park is connected) and employ a control algorithm (and its constituent parameter values) based on that static assumption. The control algorithm is used for controlling system voltage. Such a static setting requires use of control algorithm parameters that are based on the lowest SCR value that is likely to occur during the design life of the park. But such a static setting penalizes performance of the wind turbine park because it applies the same control algorithm for all values of actual SCR. For example, applying a control algorithm that exhibits a slow response, which is customary for use with weak systems, to a system that exhibits a stronger short circuit strength protracts the system recovery time. In certain applications this protracted recovery time may be detrimental to the system.

The principal intent of the present invention is to regulate the system voltage during steady state conditions (i.e., normal; system operation) and during faults. Although system response during faults is important, regulation during faults is of less importance only because the faults occur infrequently.

A weak system generally requires a slow response to control the system voltage or a fast response with supplemental stabilization controls can be employed. During steady state operation of a very weak system, the opening or closing of a relatively small circuit breaker may cause voltage oscillations or flicker. A strong system permits a fast response without the need for supplemental stabilization controls. In any case, the present invention determines the short circuit strength and executes the appropriate control algorithm to control the system voltage.

Determining the short circuit strength of the system is important because the use of a control system developed for a so-called "strong" power system may create oscillatory behavior when applied to a weak system. Conversely, the use of a weak system control algorithm typically provides a sluggish response when applied to strong systems. Adapting the control algorithm to the system's short circuit strength provides more effective system control following the occurrence of a short circuit.

To avoid use of a static control algorithm and thus avoid employing a less than optimum control algorithm, the present invention determines a short circuit strength for a proximate region of the grid (based on a determined short circuit ratio) and adjusts the control algorithm parameters accordingly to optimize the response time based on the then-prevailing system conditions. The short circuit strength can be determined periodically, randomly, on a schedule determined by the system operator or when a substantial system equipment change is made. Thus the present invention provides a dynamic or adaptive system response based on recently determined short circuit strength values. Advantageously, it is therefore not necessary to impose a static short circuit strength assumption.

Siemens, the assignee of the present invention, prefers to have a short circuit ratio of at least five when wind turbines are connected to the grid.

When the grid exhibits an SCR of less than about five, some adjustments to the wind turbine park control algorithm are preferred to accommodate the poor voltage regulation associated with this grid. For an SCR of about three or less it is necessary to use so-called "weak-grid" control algorithms, which purposely slow the rate of active power recovery (i.e., voltage) following a fault.

More generally, when a numerical value or qualitative classification of the short circuit strength has been determined for the local grid, based on the numerical value obtained from the SCR equation above, then according to the present invention the control algorithm for the wind turbine park is adjusted responsive to that numerical value or qualitative classification. Further, each time the numerical value or qualitative classification has been determined, the control algorithm for the wind turbine park is modified (e.g., certain parameters associated with the control algorithm are adjusted).

The following methodology is employed to determine an SCR value. It is known that a step reactive power injection of $\Delta Q$, in a system with a short circuit MVA of MVAsc, causes a voltage change of $\Delta V$ in accordance with $$\Delta V/V = \Delta Q/MVAsc \qquad (2)$$

where:
V is a system voltage before the reactive power injection or absorption,
$\Delta V$ is a change in the system voltage due to the reactive power injection and
$\Delta Q$ is the reactive power injection. V and $\Delta V$ are per unit voltage quantities.

For example, if the MVAsc value is 1000 MVA, and V is 1 per unit (100%), an injection of 20 MVA (reactive power) increases the voltage by about 2%. If MVAsc is 500 MVA, the same injection causes a 4% change in the system voltage.

By using equation (2) above, the present invention determines the MVAsc by determining the system voltage (V) before the reactive power injection (or absorption), injecting (or absorbing) a known amount of reactive power ($\Delta Q$) into the system, and measuring the resulting system voltage change ($\Delta V$). Equation (1) above is then used to determine the SCR, i.e., by dividing the MVAsc value by a sum of the "local" turbine MW thermal ratings. The amount by which the voltage changes ($\Delta V$) indicates the system's short circuit strength.

Thus one can use this methodology to estimate the short circuit strength of the system with reasonable accuracy. The effect will be particularly prevalent, and easily observed, for the low short circuit strength values (a "weak" system) normally encountered near wind facilities.

Although this analysis is simplified in that if the injection of reactive power is provided by turbines the turbine terminal voltage also changes, this complexity can be easily considered in a more detailed analysis.

In lieu of changing the turbine terminal voltage, the reactive power injected into (or absorbed from) the system can also be obtained by switching capacitors or reactors into or out from the power system.

Changing the reactive power injected into or absorbed from the grid (e.g., stepping it up or down) to determine MVAsc and then employing equation (1) to determine the SCR, according to the present invention, offers a convenient technique to estimate the short circuit strength of a system.

Figure 2:
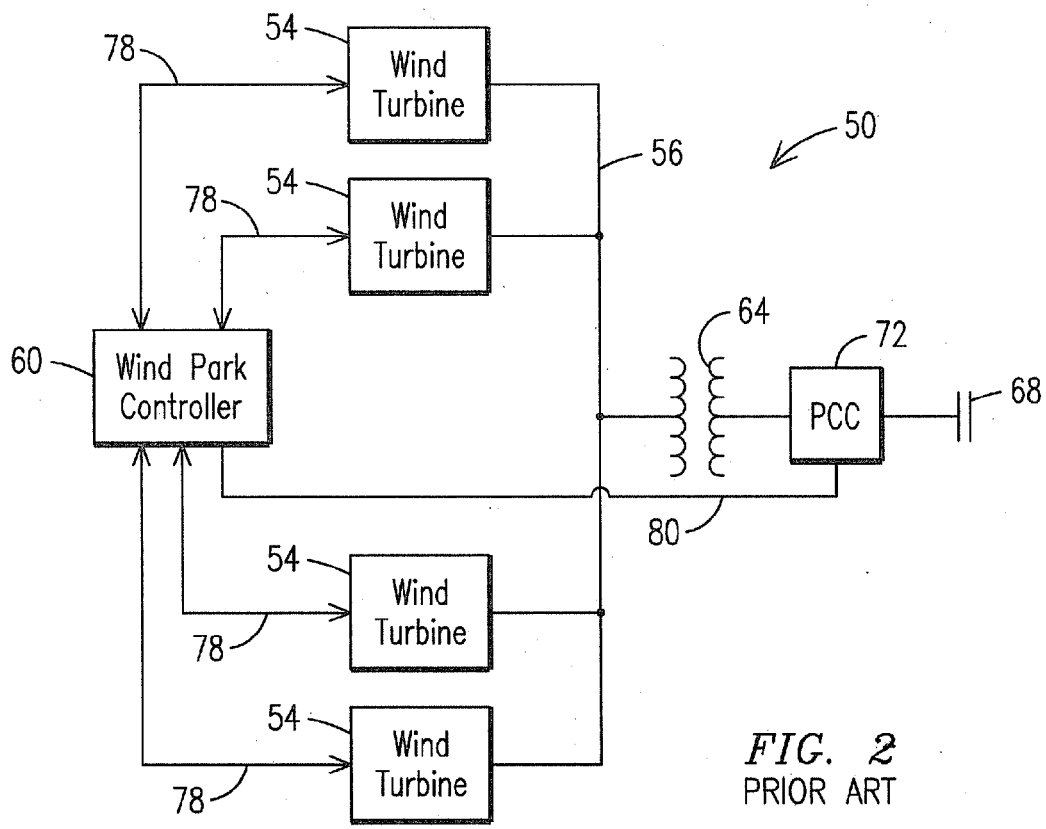
FIG. 2 is a block diagram of a prior art wind turbine park.

In one embodiment, after changing the reactive power the system voltage is measured at the wind turbine park terminals, i.e., where the wind park is connected to the grid (the PCC 72 of FIG. 2). This measurement can be made at either the high voltage side or the low voltage side of the transformer that connects the park to the grid. The voltage can also be measured at the output terminals of the wind turbines. Preferably the voltage is measured at the turbine terminals. The amount of reactive power change and the resulting line voltage change is used to determine the short circuit strength of the system as explained above.

In many systems, the normal SCR value may be high and therefore indicative of a strong system. But the value may fall by about an order of magnitude when a line outage or a generator outage (in particular a proximate generator) occurs. Such a change in the operative system components and its effect on the SCR must therefore be considered in selecting appropriate parameters for the wind turbine park control algorithm. Thus according to the present invention, whenever there is a significant change in the system components the SCR value should be determined and the appropriate parameters for the wind turbine park control algorithm selected.

This determined SCR can then be used to dynamically (and at various times as desired) adjust gains, time delays, and other parameters of the control algorithm to optimize performance of the voltage regulation system and the power controls of the wind park.

Preferably the control algorithm parameters to be adjusted comprise the proportional and integral gains, both at the turbine and at the wind park. These algorithms comprise adjustments in the gains and power recovery rates. Also, the ramp-up rate (time constant) of real power following a low-voltage incident can be adjusted.

Preferably, the parameters to be adjusted and the amount of parameter adjustment for different system strength levels can be predetermined then put into operation as required based on the determined system strength. This technique is a significant improvement over the prior art methodology that uses one set of algorithm parameters for all systems and for all SCR values.

The parameters to be adjusted and the amount of parameter adjustment (or a new parameter value) are referred to as a parameter adjustment recipe. Each recipe may contain a value for one or more of the parameters used in the wind turbine park control algorithm. For example a first recipe may contain a value for a first parameter used in the algorithm, and a second recipe may contain a value for the first and also a second parameter in the algorithm.

For example, for a very weak system the gains are adjusted appropriately, but the adjustment is generally accomplished on a site-by-site basis. For a system with an SCR value of between about 2 and 3 the parameter adjustment recipe may suggest setting Kp (proportional gain) to about 2, Ki (integral gain) to about 0.3, and power ramp rate to 5% per minute). If the SCR falls below 2 a different parameter adjustment recipe is used for changing the control algorithm parameters. In a weak system, it is generally important to refrain from generating too much real power immediately after a low voltage condition, so reactive power is used to stabilize the system voltage, i.e., prevent the system voltage from oscillating excessively.

In a strong system full power production can begin immediately after the low voltage condition disappears.

This invention provides an inexpensive but useful improvement in control performance, particularly in situations where a weak grid control is used because of the possibility, which in practice seldom occurs, of a line or generator outage.

Figure 3:
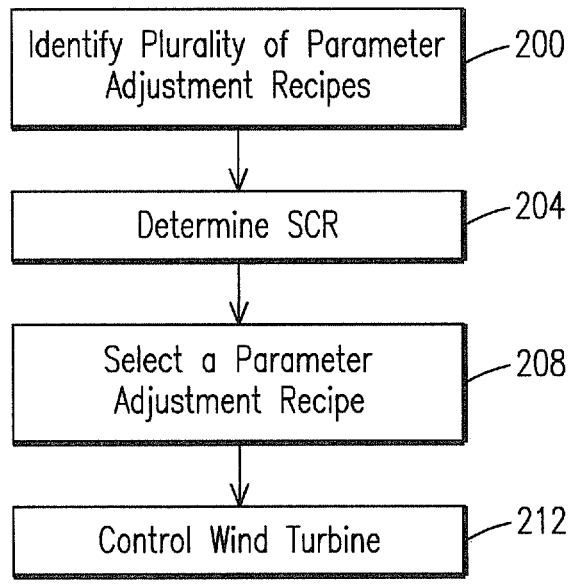
FIG. 3 is a flow chart depicting one embodiment of method steps associated with the present invention.

FIG. 3 illustrates a block diagram associated with the present invention for adaptively controlling a wind turbine park. At a step 200 a plurality of parameter adjustment recipes for use in the wind turbine park control algorithm for controlling an output of the wind turbine park are identified. At a step 204 a system short circuit ratio is determined. At a step 208 a parameter adjustment recipe is selected from among the plurality of parameter adjustment recipes responsive to the determined short circuit ratio. At a step 212 the output of the wind turbine park is controlled according to the selected parameter control recipe as used in the wind turbine park control algorithm.

With reference to FIG. 2, the control algorithm for controlling the wind turbine park output resides in the controller 60 or within one or more of the wind turbines 54.

Figure 4:
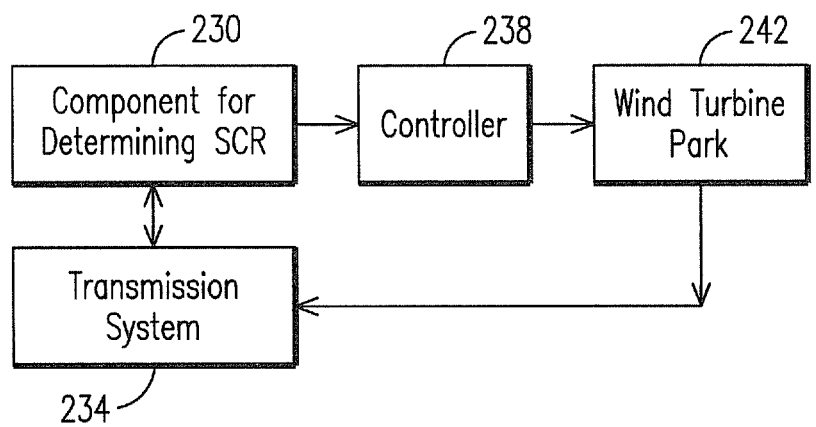
FIG. 4 is a block diagram of a system for controlling a wind turbine park.

A block diagram of FIG. 4 depicts a component 230 for determining an SCR value of a transmission system 234 as described above. The component supplies the determined SCR value to a controller 238. A parameter adjustment ratio is selected either in the component 230 or in the controller 238. In either case the parameter adjustment ratio is responsive to the determined SCR value and is applied to the control algorithm executed in the controller 238 to control the output of a wind park 242.

In another embodiment the parameter adjustment recipes are selected according to a predetermined range of SCR values. For example, a first parameter adjustment recipe is used for an SCR value between 2 and 3 and a second parameter adjustment recipe is used for an SCR value between 3 and 4. Those ranges can be selected (e.g., wide ranges or narrow ranges) according to the degree of granularity desired in selecting a parameter adjustment recipe and the algorithm parameters embodied in that recipe.

According to yet another embodiment, synchrophasor information is used to assess the system short circuit strength. This information is used to dynamically update the short circuit strength, based on which control algorithm parameters are selected, without the need to periodically inject reactive power into the transmission system or grid.

In the wind turbine park 50 of FIG. 2, the feeder or collector 56 typically comprises an underground cable and thus the system impedance is approximately the same for all wind turbines 56 in the turbine park 50. Therefore the same parameter adjustment recipe is implemented for each wind turbine 54.

In some installations the wind farm comprises several sub-parks that are connected via overhead lines. In this configuration it may be desirable to use different parameter adjustment recipes for each sub-park as all will see a different system impedance.

According to yet another embodiment, the ratio of system reactance to resistance (X/R) is determined by measuring a timed response of the system. Systems with a low X/R ratio are typically low voltage systems with a low SCR. The X/R ratio can be another useful parameter to use in optimizing gain values in the various parameter adjustment ratios for use in the wind turbine park control algorithm. A system with a high X/R ratio (a high reactance-to-resistance ratio) has a longer response time than one with a low X/R ratio. Although this ratio is typically a secondary consideration in selecting control algorithm parameters, it can be used to further fine tune the algorithm parameters.

Although the invention has been shown and described with respect to a certain preferred embodiments, it is obvious that equivalent alterations and modifications will occur to others skilled in the art upon the reading and understanding this specification and the annexed drawing. In particular regard to the various functions performed by the above described components (assemblies, devices, circuits, etc.), the terms used to describe such components are intended to correspond, unless otherwise indicated, to any component that performs the specified function of the described component (i.e., that is functionally equivalent), even though not structurally equivalent to the disclosed structure that performs the function in the illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

While various embodiments of the present invention have been shown and described herein, it will be obvious that such embodiments are provided by way of example only. Numerous variations, changes and substitutions may be made without departing from the invention herein. Accordingly, it is intended that the invention be limited only by the spirit and scope of the appended claims.

The invention claimed is:

1. A wind turbine park connected to a transmission system, the wind turbine park comprising:
a component for determining a short circuit ratio responsive to a known quantity of reactive power ($\Delta Q$) injected into or absorbed from the transmission system, a transmission system voltage (V) prior to injecting or absorbing the known quantity of reactive power, a change in the transmission system voltage ($\Delta V$) after injecting or absorbing the known quantity of reactive power, a short circuit megavolt-amperes rating of the transmission system (MVAsc), and a total megawatt capability of the wind turbine park (MWt);
a controller for controlling an output of the wind turbine park, the controller for executing a control algorithm using one or more parameters in the control algorithm that are determined responsive to the short circuit ratio, the one or more parameters determined within the component or within the controller.

2. The wind turbine park of claim 1 wherein the component determines the short circuit ratio according to one of a predetermined schedule, periodically, randomly and whenever a significant change occurs in system components.

3. The wind turbine park of claim 2 wherein a significant change in system components comprises one of a generator outage, a transmission line outage, a generator placed back into service and a line placed back into service.

4. The wind turbine park of claim 1 wherein the component determines the short circuit ratio from an equation $$SCR = MVAsc/MWt.$$

5. The wind turbine park of claim 4 wherein the component determines MVAsc from an equation $$\Delta V/V = \Delta Q/MVAsc.$$

6. The wind turbine park of claim 5 wherein the component injects reactive power into the transmission system by switching a capacitor into the transmission system or by switching a reactor out of the transmission system.

7. The wind turbine park of claim 5 wherein the component absorbs reactive power from the transmission system by switching a capacitor out of the transmission system or by switching a reactor into the transmission system.

8. The wind turbine park of claim 1 wherein the one or more parameters comprise one or more of a proportional gain value, an integral gain value and a ramp-up rate value.

9. The wind turbine park of claim 1 wherein the wind turbine park comprises a plurality of sub-parks connected via overhead transmission lines, and wherein the method is executed independently for each sub-park.

10. A method for adaptively controlling a wind turbine park according to a determined short circuit strength of a transmission system to which the wind turbine park supplies power, wherein a plurality of parameters for use in a wind turbine park control algorithm are available, the method comprising:
   (a) determining a system short circuit ratio responsive to injecting into or absorbing from the transmission system a known quantity of reactive power ($\Delta Q$), determining a transmission system voltage (V) prior to injecting or absorbing the known quantity of reactive power, determining a change in the transmission system voltage ($\Delta V$) after injecting or absorbing the known quantity of reactive power, determining a short circuit megavolt-amperes rating of the transmission system (MVAsc), and determining a total megawatt capability of the wind turbine park (MWt);
   (b) selecting one or more parameters for use in the control algorithm from the plurality of parameters responsive to the system short circuit ratio determined at a step (a); and
   (c) controlling the output of the wind turbine park according to the control algorithm by using the one or more parameters.

11. The method of claim 10 wherein a step of determining is executed according to one of a predetermined schedule, periodically, randomly and whenever a significant change occurs in system components.

12. The method of claim 10 wherein the step of determining comprises determining the system short circuit ratio from an equation $$SCR = MVAsc/MWt.$$

13. The method of claim 12 further comprising determining MVAsc from $$\Delta V/V = \Delta Q/MVAsc.$$

14. The method of claim 12 wherein injecting reactive power into the transmission system comprises switching a capacitor into the transmission system or switching a reactor out of the transmission system, and wherein absorbing reactive power from the transmission system comprises switching a capacitor out of the transmission system or switching a reactor into the transmission system.

15. The method of claim 10 wherein the one or more parameters comprise one or more of a proportional gain, an integral gain and a ramp-up rate.

16. The method of claim 10 wherein the wind turbine park comprises a plurality of sub-parks connected via overhead transmission lines, and wherein the method is executed independently for each sub-park.

* * * * *